United States Patent
Lee

(10) Patent No.: US 9,414,485 B2
(45) Date of Patent: Aug. 9, 2016

(54) PEELABLE METAL SUBSTRATE HAVING MODIFIED SURFACE AND METHOD OF MANUFACTURING THE SAME

(71) Applicant: AZOTEK CO., LTD., Taoyuan Hsien (TW)

(72) Inventor: Hung-Jung Lee, Taoyuan Hsien (TW)

(73) Assignee: AZOTEK CO., LTD., Taoyuan (TW)

( * ) Notice: Subject to any disclaimer, the term of this patent is extended or adjusted under 35 U.S.C. 154(b) by 0 days.

(21) Appl. No.: 14/476,752

(22) Filed: Sep. 4, 2014

(65) Prior Publication Data

US 2015/0257253 A1    Sep. 10, 2015

(30) Foreign Application Priority Data

Mar. 7, 2014 (TW) .............................. 103107985 A

(51) Int. Cl.
*H05K 1/02* (2006.01)
*H05K 1/03* (2006.01)
(Continued)

(52) U.S. Cl.
CPC .............. *H05K 1/028* (2013.01); *H05K 1/0313* (2013.01); *H05K 1/056* (2013.01); *H05K 3/007* (2013.01); *H05K 3/0011* (2013.01); *H05K 3/0097* (2013.01); *H05K 3/44* (2013.01); *H05K 3/46* (2013.01); *H05K 1/0298* (2013.01); *H05K 1/0346* (2013.01); *H05K 1/0393* (2013.01); *H05K 3/06* (2013.01); *H05K 2201/0133* (2013.01); *H05K 2201/0154* (2013.01); *H05K 2201/0355* (2013.01); *H05K 2203/06* (2013.01); *H05K 2203/10* (2013.01);

(Continued)

(58) Field of Classification Search
CPC ............. H05K 1/02; H05K 1/03; H05K 1/05; H05K 3/00; H05K 3/44; H05K 3/46; H05K 1/028; H05K 1/0313; H05K 1/0298; H05K 1/056; H05K 3/0011; H05K 2201/0133; H05K 2203/06; H05K 2203/10; H05K 1/039
USPC ...................................... 156/272.2, 308.6, 60
See application file for complete search history.

(56) References Cited

U.S. PATENT DOCUMENTS

2005/0150595 A1*  7/2005  Jo ........................ B32B 37/1207
                                                               156/313
2013/0256002 A1* 10/2013  Ozeki ..................... C08G 69/48
                                                               174/251

FOREIGN PATENT DOCUMENTS

JP      2002353582 A     12/2002
JP      2003338671 A     11/2003
(Continued)

*Primary Examiner* — Selim Ahmed
(74) *Attorney, Agent, or Firm* — CKC & Partners Co., Ltd.

(57) ABSTRACT

A metal substrate includes a first insulating substrate, a second insulating substrate, a first metal layer, a second metal layer and a release layer. The first insulating substrate has a first modified surface and a second surface opposite to the first modified surface. The first metal layer faces the second surface. The release layer is bonded on the first modified surface. The second insulating substrate is bonded on a side of the release layer, such that the release layer is between the first modified surface and the second insulating substrate. The second metal layer is disposed on a side of the second insulating substrate, such that the second insulating substrate is between the release layer and the second metal layer. An original surface roughness of the first modified surface has a variation substantially less than 10% after the first modified surface is released from the release layer.

9 Claims, 5 Drawing Sheets

(51) Int. Cl.
*H05K 1/05* (2006.01)
*H05K 3/00* (2006.01)
*H05K 3/44* (2006.01)
*H05K 3/46* (2006.01)
*H05K 3/06* (2006.01)

(52) U.S. Cl.
CPC ...... *H05K 2203/1536* (2013.01); *Y10T 156/10* (2015.01); *Y10T 428/1438* (2015.01); *Y10T 428/24355* (2015.01)

(56) References Cited

FOREIGN PATENT DOCUMENTS

| | | |
|---|---|---|
| JP | 2010125794 A | 6/2010 |
| JP | 2011020399 A | 2/2011 |
| WO | 2008004520 A1 | 1/2008 |
| WO | 2011093427 A1 | 8/2011 |

\* cited by examiner

PEELABLE METAL SUBSTRATE HAVING MODIFIED SURFACE AND METHOD OF MANUFACTURING THE SAME

RELATED APPLICATIONS

This application claims priority to Taiwan Application Serial Number 103107985, filed Mar. 7, 2014, which is herein incorporated by reference.

BACKGROUND

1. Field of Invention

The present disclosure relates to an electronic circuit substrate and a method of manufacturing the electronic circuit substrate. More particularly, the present disclosure relates to a metal substrate and a method of manufacturing the metal substrate.

2. Description of Related Art

A printed circuit board is an indispensable material in electronic products. A demand of the printed circuit board is increased with a growing demand of consumer electronic products. With the development toward compact size and flexibility for the electronic products, a flexible printed circuit board is widely applied recently in computers and its peripheral equipment, communication products and consumer electronic products because of its features able to be bent and be three-dimensionally wired.

A typical flexible printed circuit board is a composite board constituted by a dielectric substrate, such as resin, glass fiber or other plastic materials, and a conductive layer, such as copper foil or other metal material layers. For example, a flexible copper dad laminate is constituted by a polyimide (PI) substrate as the dielectric substrate, and a non-adhesive single-sided copper foil coated or bonded on the PI substrate using a casting method or a lamination method.

Recently, it is required for the flexible printed circuit board to be ultra-thin, high density of components and multifunction, in that an electronic system is becoming compact and low cost. However, fold damage, pad damage or delamination (or called as blistering) may occur in a single layer PI substrate for manufacturing an ultra-thin flexible printed circuit board during processing due to inadequate stiffness of the substrate, and thus to affect production yield and dimensional stability. For this reason, an adhesive layer formed on a surface of the single layer PI substrate using a coating method or a transfer printing method and a reinforcing layer overlying the adhesive layer are introduced and a lamination is then performed to let the reinforcing layer tightly adhere to the PI substrate to obtain a composite structure and to reinforce the ultra-thin copper clad substrate, and thus to increase yield thereof.

However, during the thermal lamination with high temperature and high pressure, the adhesive may be fused and bonded to the PI substrate. The adhesive may be remained during the reinforcing layer is tore off, which results in increasing of product defect rate. If the reinforcing layer is retained, the thickness of the flexible printed circuit board is increased. Therefore, there is a need for an advanced printed circuit board and a method of manufacturing the same to solve problems in prior art.

SUMMARY

The present disclosure provides a metal substrate including a first insulating substrate, a second insulating substrate, a first metal layer, a second metal layer and a release layer. The first insulating substrate has a first modified surface and a second surface opposite to the first modified surface. The first metal layer faces the second surface. The release layer is bonded on the first modified surface, such that the first insulating substrate is between the release layer and the first metal layer. The second insulating substrate is bonded on a side of the release layer, such that the release layer is between the first modified surface and the second insulating substrate. The second metal layer is disposed on a side of the second insulating substrate, such that the second insulating substrate is between the release layer and the second metal layer. Each of the first insulating substrate and the second insulating substrate is made of a material selected from the group consisting of polyimide (PI), polyethylene terephthalate (PET), Teflon, liquid crystal polymer (LCP), polyethylene (PE), polypropylene (PP), polystyrene (PS), polyvinyl chloride (PVC), Nylon (polyamide), acrylic resin, acrylonitrile-butadiene-styrene (ABS), phenolic resin, epoxy resin, polyester, silicone, polyurethane (PU), polyamide-imide (PAI) and a combination thereof. The first modified surface has an original surface roughness, and the original surface roughness has a variation substantially less than 10% after the first modified surface is released from the release layer.

According to one embodiment of the present disclosure, the metal substrate further includes a first adhesive layer between the first insulating substrate and the first metal layer. According to one embodiment of the present disclosure, the metal substrate further includes a second adhesive layer between the second insulating substrate and the second metal layer. According to one embodiment of the present disclosure, the metal substrate further includes a first adhesive layer between the first insulating substrate and the first metal layer and a second adhesive layer between the second insulating substrate and the second metal layer.

According to one embodiment of the present disclosure, a side of the second insulating substrate facing the release layer has a second modified surface the same as the first modified surface.

According to one embodiment of the present disclosure, the release layer includes an elastomer c pressure sensitive adhesive or a resin-based pressure sensitive adhesive.

According to one embodiment of the present disclosure, the first modified surface includes at least one functional group selected from the group consisting of —$CH_3$, —$CH_2$, —O—, —COOH, —$COOHCH_3$, —$COOHC_2H_5$, —$NH_2$, —$NO_2$, —OH, —$CONH_2$, —CONH, —$SiO_2$ and a combination thereof.

According to one embodiment of the present disclosure, the first modified surface has a surface energy substantially greater than 3 dyne/cm.

According to one embodiment of the present disclosure, the first metal layer and the second metal layer include Cu, Al, Au, Ag, Sn, Pb, Sn—Pb Alloy, Fe, Pd, Ni, Cr, Mo, W, Zn, Mn, Co, stainless steel or a combination thereof.

The present disclosure also provides a method of manufacturing the metal substrate including providing a first single-sided substrate structure including a first insulating substrate and a first metal layer, in which the first insulating substrate has a first surface and a second surface opposite to the first surface, and the second surface is between the first surface and the first metal layer. A first modification process is performed on the first surface. A release layer is provided. A second single-sided substrate structure including a second insulating substrate and a second metal layer is provided. The first single-sided substrate structure and the second single-sided substrate structure are then bonded on the release layer, in which the release layer is between the first surface and the second insulating substrate, and the second insulating substrate is between the release layer and the second metal layer. Each of the first insulating substrate and the second insulating substrate is made of a material selected from the group consisting of PI, PET, Teflon, LCP, PE, PP, PS, PVC, Nylon, acrylic resin, ABS, phenolic resin, epoxy resin, polyester, silicone, PU, PAI and a combination thereof. The first surface has an original surface roughness, and the original surface roughness of the first surface has a variation substantially less than 10% after the first surface is released from the release layer.

According to one embodiment of the present disclosure, providing the first single-sided substrate structure further includes providing a first adhesive layer between the first insulating substrate and the first metal layer.

According to one embodiment of the present disclosure, providing the second single-sided substrate structure further includes providing a second adhesive layer between the second insulating substrate and the second metal layer.

According to one embodiment of the present disclosure, the method further includes performing a second modification process on a surface of the second insulating substrate facing the release layer before bonding the first single-sided substrate structure and the second single-sided substrate structure on the release layer.

According to one embodiment of the present disclosure, the first modification process includes a plasma process, an UV irradiation process or a soaking process with an alkali solution.

According to one embodiment of the present disclosure, the release layer includes an elastomeric pressure sensitive adhesive or a resin-based pressure sensitive adhesive.

According to one embodiment of the present disclosure, the first surface includes at least one functional group selected from the group consisting of —$CH_3$, —$CH_2$, —O—, —COOH, —$COOHCH_3$, —$COOHC_2H_5$, —$NH_2$, —$NO_2$, —OH, —$CONH_2$, —CONH, —$SiO_2$ and a combination thereof.

According to one embodiment of the present disclosure, the first surface has a surface energy substantially greater than 3 dyne/cm.

According to one embodiment of the present disclosure, the first metal layer and the second metal layer include Cu, Al, Au, Ag, Sn, Pb, Sn—Pb Alloy, Fe, Pd, Ni, Cr, Mo, W, Zn, Mn, Co, stainless steel or a combination thereof.

According to the above embodiments, the present disclosure provides a metal substrate, which includes two metal substrates of single-sided substrate structure respectively having an insulating substrate and a metal layer, and the insulating substrates are bonded to each other by a release layer. A modification process is performed on a bonding surface of one of the insulating substrates of the metal substrates of the single-sided substrate structure to form a modified surface. When the insulating substrate is released from the release layer (or the other insulating substrate), the modified surface has a surface roughness variation substantially less than 10% compared to the original surface roughness before the modified surface is bonded on the release layer.

The double-layer metal substrate can be used to manufacture a printed circuit board to not only enhance structural strength of the metal substrates of the single-sided substrate structure but also prevent fold damage, pad damage or delamination (or called as blistering), and thus to increase yield of the printed circuit board. Further, because the modified surface of the insulating substrate has a low surface energy, and thus the insulating substrate can be bonded on and then easily released from the release layer without any residual adhesive, the two metal substrates of the single-sided substrate structure can be temporarily laminated and then separated after a whole process of the printed circuit board is performed to form two printed circuit boards respectively having the single-sided substrate structure, and thus to significantly increase efficiency and productivity of the printed circuit board process.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

The present disclosure provides a metal substrate of double-sided substrate structure including two metal substrates of single-sided substrate structure bonded to each other through a release layer, and one of the insulating substrates of the metal substrates of the single-sided substrate structure can be temporarily bonded or debonded to the release layer or called as insulating bonding layer), and thus to avoid fold damage, pad damage or delamination (or called as blistering) during processing and to increase process yield and efficiency. In order to let the above description, objects, features and advantages of the present disclosures be more apparent, preferable embodiments of the metal substrate and a method of manufacturing the same are provided and accompanied with figures and described in detail below.

Figure 1A:
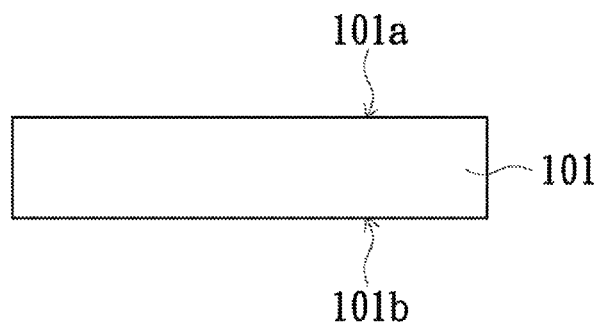
FIGS. 1A-1F are cross-sectional views at various stages of manufacturing a metal substrate of double-sided substrate structure according to one embodiment of the present disclosure.

FIGS. 1A-1F are cross-sectional, views at various stages of manufacturing a metal substrate 100 of double-sided substrate structure according to one embodiment of the present disclosure. The method of manufacturing the metal substrate 100 of the double-sided substrate structure includes: providing a first insulating substrate 101 having a first surface 101a and a second surface 101b opposite to each other, as shown in FIG. 1A.

In some embodiments of the present disclosure, the first insulating substrate 101 may be a bakelite plate, glass fiber plate or variety of plastic plates, such as polyimide (PI), polyethylene terephthalate (PET), Teflon, liquid crystal polymer (LCP), polyethylene (PE), polypropylene (PP), polystyrene (PS), polyvinyl chloride (PVC), Nylon (polyamide), acrylic resin, acrylonitrile-butadiene-styrene (ABS), phenolic resin, epoxy resin, polyester, silicone, polyurethane (PU), polyamide-imide (PAI) and a combination thereof.

In one embodiment of the present disclosure, the first insulating substrate 101 may be an insulating portion composed of glass fibers, non-woven material and resin, and the insulating portion is then laminated with epoxy resin and a copper foil to form a prepreg. In another embodiment of the present disclosure, the first insulating substrate 101 may be a flexible PI film, PET film or Teflon film. In the embodiment, the first insulating substrate 101 is a PI film with a thickness preferably substantially in a range of 5 µm to 200 µm, which has a linear thermal expansion coefficient substantially in a range of 5 ppm/° C. to 60 ppm/° C. and a glass transition temperature (Tg) substantially in a range of 200° C. to 450° C.

The PI film is synthesized using dianhydride compound, diamine compound monomer and a solvent containing poly amic acid solution. The dianhydride compound includes one or more kinds of 2,2-bis(3,4-dicarboxyphenyl)hexafluoropropane dianhydride (6FDA), 4-(2,5-dioxo-tetrahydrofuran-3-yl)-1,2,3,4-tetrahydro-naphthalenesuccinic dianhydride (TDA), pyromellitic dianhydride (1,2,4,5-pyromellitic dianhydride, PMDA), benzophenone tetracarboxylic dianhydride (BTDA), biphenyltetracarboxylic dianhydride (BPDA), 4,4,-oxydiphthalic dianhydride (4,4,-ODPA), 3,4-oxydiphthalic dianhydride (3,4,-ODPA), bis dicarboxyphenyl dimethylsilane dianhydride (SiDA), bis(dicarboxyphenoxy)diphenyl sulfide dianhydride (BDSDA), 1,4,5,8-naphthalenetetracarboxylicdianhydride (NTCDA), hydroquinone diphthalic anhydride (HQDA), 4,4'-bisphenol A dianhydride (BPADA), 3,3',4,4'-diphenylsulfone tetracarboxylic dianhydride (DSDA), 1,3-dihydro-1,3-dioxo-5-isobenzofurancarboxylic acid phenylene ester (TAHQ), sulfonyldiphthalic anhydride (SO2DPA), cyclobutane-1,2,3,4-tetracarboxylic dianhydride (CBDA) or isopropylidene diphenoxy bis-phthalic anhydride (6HBDA) but not limited thereto.

The diamine compound includes one or more kinds of 4,4'-oxydianiline (4,4'-ODA), 3,4'-oxydianiline (3,4'-ODA), 3,3'-dihydroxy-4,4'-diamino-biphenyl (HAB), para-phenylenediamine (p-PDA), meta-phenylenediamine (m-PDA), para-methylene diamine (pMDA), meta-methylene diamine (mMDA), bis aminophenoxy benzene (133APB, 134APB), bis aminophenoxy phenyl hexafluoropropane (4BDAF), bis aminophenyl hexafluoropropane (33-6F, 44-6F), bis aminophenyl sulfone (4DDS, 3DDS) 2,2-bis(4-[4-aminophenoxy]phenyl)propane (BAPP), 2,2-bis(4-[3-aminophenoxy] phenyl)sulfone (m-BAPS), 1,4-bis(4-aminophenoxy) benzene (TPE-Q), 1,3-bis(4-aminophenoxy)benzene (TPE-R), 1,3-bis(3-aminophenoxy)benzene (APB), 4,4'-bis(4-aminophenoxy)biphenyl (BAPB), 1,4-bis(4-aminophenoxy)-2,5-di-t-butylbenzene (DTBAB), 4,4'-bis(4-aminophenoxy)benzophenone (BAPK), bis(trifluoromethyl) benzidine (TFDB), cyclohexanediamine (13CHD, 14CHD), bis aminophenoxy phenyl propane (6HMDA), bis aminohydroxyphenyl hexafluoropropane (DBOH) or bis aminophenoxy diphenyl sulfone (DBSDA), but not limited thereto.

The solvent containing the poly amic acid solution includes one or more kinds of N-methyl-2-pyrrolidone (NMP), N,N-dimethylacetamide (DMAc), γ-butyrolactone (GBL), dimethylformamide (DMF), 2-butoxyethanol or 2-ethoxyethanol, but not limited thereto.

In some preferable embodiments of the present disclosure, the PI film is synthesized using BPDA, PDA and ODA with a preferable molar ratio of 1:0.5:0.5, 1:0.7:0.3 or 1:0.3:0.7.

Figure 1B:
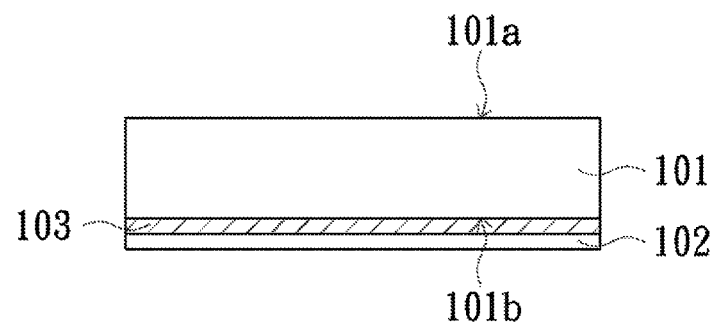

Next, a first adhesive layer 103 is formed on the second surface 101b of the first insulating substrate 101. A first metal layer 102 is then formed on a side of the first adhesive layer 103, such that the first adhesive layer 103 is between the second surface 101b of the first insulating substrate 101 and the first metal layer 102 to form a three-layer composite structure, as shown in FIG. 1B.

In some embodiments of the present disclosure, the first metal layer 102 includes Cu, Al, Au, Ag, Sn, Pb, Sn—Pb Alloy, Fe, Pd, Ni, Cr, Mo, W, Zn, Mn, Co, stainless steel or a combination thereof. For example, in the embodiment, the first metal layer 102 may be a copper foil with a thickness substantially in a range of 3 µm to 210 µm, and it can be bonded on the second surface 101b of the first insulating substrate 101 through the thermoplastic first adhesive layer 103 using a thermal lamination method with high temperature and high pressure. The first adhesive layer 103 includes epoxy resin, phenoxy resin, acrylic resin, polyurethane resin, silicone rubber, poly-para-xylene (or called as parylene), bismaleimide resin, polyimide resin or a combination thereof.

Figure 1C:
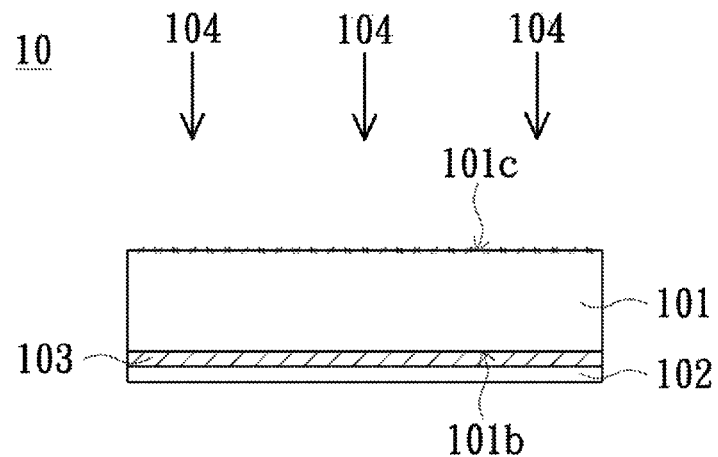

Subsequently, a modification process 104 is performed on the first surface 101a of the first insulating substrate 101 to form a modified surface 101c, and thus to form a metal substrate 10 of single-sided substrate structure, as shown in FIG. 1C. In some embodiments of the present disclosure, the modification process 104 may be a plasma process. For example, argon and nitrogen are used to modify the first surface 101a of the first insulating substrate 101, in which a gas flow rate is substantially in a range of 50 L/min to 100 L/min; a content ratio of argon to nitrogen is substantially in a range of 1:1 to 1:20; an operating voltage is substantially in a range of 300 V to 600 V; an operating time is substantially in a range of 10 seconds to 50 seconds. In a preferable embodiment of the present disclosure, the modification process 104 has a gas flow rate of substantially 70 L/min, a content ratio of argon to nitrogen of substantially 3:8, an operating voltage of substantially 500V and an operating time of substantially 20 seconds.

In other embodiments of the present disclosure, the modification process may be an UV irradiation process. For example, under a vacuum degree of substantially 2 torr, UV light with a wavelength substantially in a range of 180 am to 270 nm is irradiated on the first surface 101a of the first insulating substrate 101 for substantially 20 seconds to 80 seconds. In some embodiments of the present disclosure, UV light with a preferable wavelength of 182 nm, 184 nm or 254 nm is irradiated on the first surface 101a of the first insulating substrate 101 for 60 seconds, in which UV light with the wavelength of 182 nm is more preferred.

In some embodiments of the present disclosure, the modification process may be a soaking process with an alkali solution. For example, the first surface 101a of the first insulating substrate 101 is soaked in hydrazine ($N_2H_4$), potassium hydroxide (KOH), sodium hydroxide (NaOH) aqueous solution or a combination thereof with a weight percentage concentration of substantially greater than 5%, and a reaction time is substantially in a range of 20 seconds to 80 seconds.

After the modification process 104 is performed, the modified surface 101c has a surface energy substantially in a range of 3 dyne/cm to 30 dyne/cm, preferably substantially in a range of 15 dyne/cm to 25 dyne/cm compared to deionized water with conductivity of about 0.055 µS/cm (25° C.) and resistivity of substantially 18 MΩ·cm (25° C.). The modified surface 101c has a roughness substantially less than 3 µm.

Figure 1D:
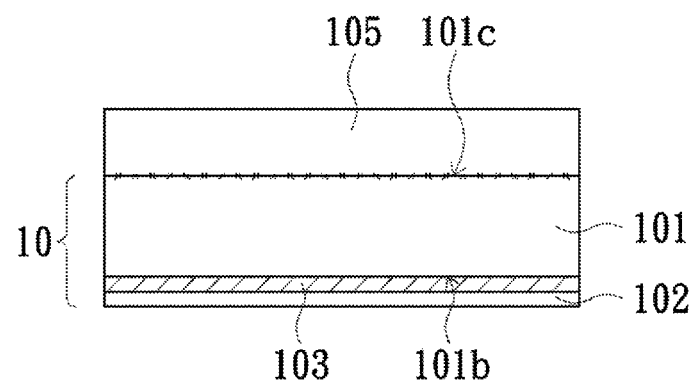

A release layer 105 is then bonded on the modified surface 101c of the first insulating substrate 101, as shown in FIG. 1D. In some embodiments, the release layer 105 may be an elastomeric pressure sensitive adhesive, which includes natural rubber pressure sensitive adhesive, synthetic rubber pressure sensitive adhesive, thermoplastic elastomeric pressure sensitive adhesive or a combination of, or a resin-based pressure sensitive adhesive, which includes polyacrylate, polyurethane, polyvinyl chloride or polyvinyl ether.

Figure 1E:
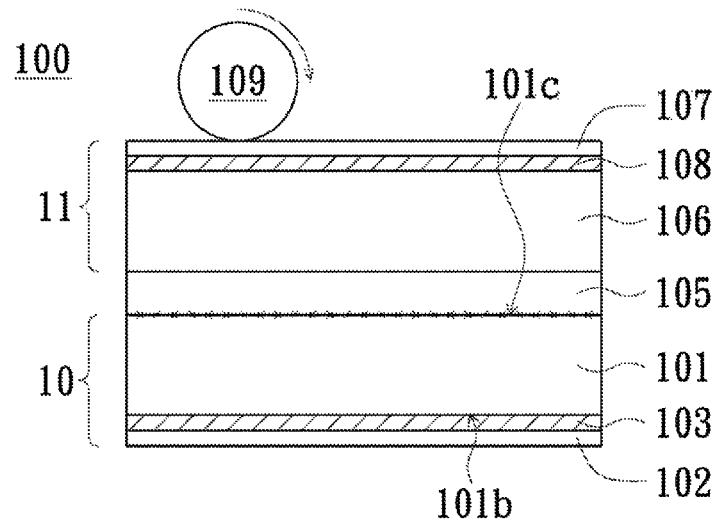

Next, a metal substrate 11 of single-sided substrate structure at least including a second insulating substrate 106 and a second metal layer 107 is bonded on the release layer 105. A thermal lamination process 109 is then performed to tightly bond the metal substrate 11 of the single-sided substrate structure on the metal substrate 10 of the single-sided substrate structure to form the metal substrate 100 of double-sided substrate structure. The release layer 105 is between the first modified surface 101c and the second insulating substrate 106, and the second insulating substrate 106 is between the release layer 105 and the second metal layer 107, as shown in FIG. 1E.

In the embodiment, the metal substrate 11 of the single-sided substrate structure and the metal substrate 10 of the single-sided substrate structure are the same, which are adhesive-containing metal substrates of the single-sided substrate structure. The metal substrate 11 of the single-sided substrate structure further includes a second adhesive layer 108 between the second insulating substrate 106 and the second metal layer 107 to bond the second metal layer 107 to the second insulating substrate 106.

In some embodiments of the present disclosure, the thermal lamination process 109 may be a hot plate lamination process, and a lamination temperature is substantially greater than 50° C., preferably in a range of 120° C. to 500° C., and more preferably of 250° C. A lamination pressure is substantially greater than 0.3 kg/cm$^2$, preferably in a range of 15 kg/cm$^2$ to 90 kg/cm$^2$, and more preferably of 20 kg/cm$^2$. In some embodiments of the present disclosure, the thermal lamination process 109 may be a heat roller lamination process, and a lamination temperature is substantially greater than 50° C., preferably in a range of 150° C. to 380° C., and more preferably of 250° C. A lamination pressure is substantially greater than 3 KN/cm, preferably in a range of 3 KN/cm to 30 KN/cm, and more preferably of 20 KN/cm. A lamination tension is substantially greater than 0.5 kg.

Figure 2:
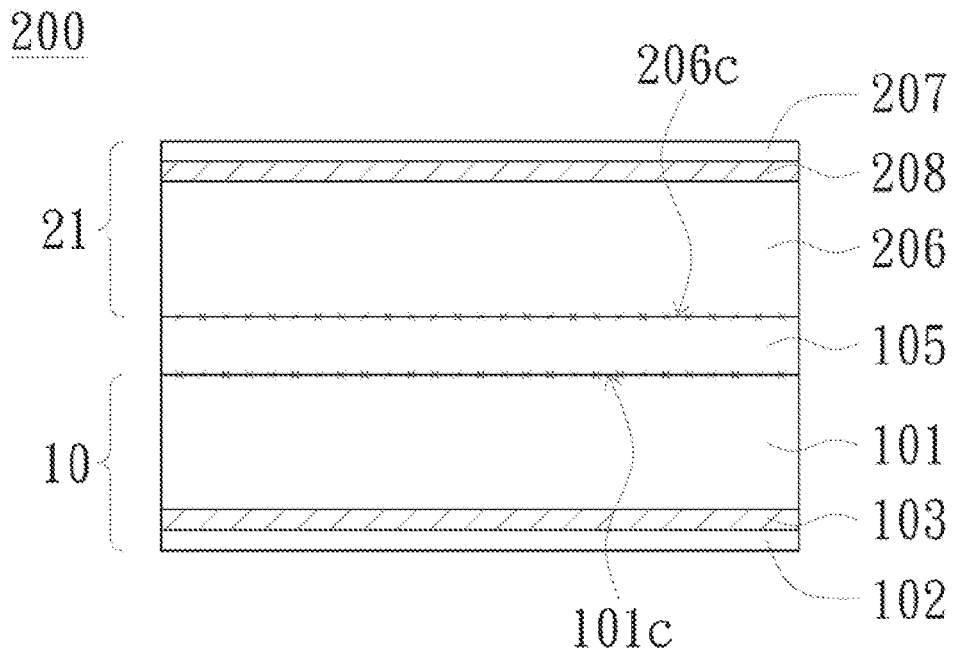
FIG. 2 is a cross-sectional view of a metal substrate of double-sided substrate structure according to another embodiment of the present disclosure.

It is noteworthy that the metal substrate of the single-sided substrate structure bonded on the first modified surface 101c of the first insulating substrate 101 may have a second modified surface the same as the first modified surface 101c of the first insulating substrate 101. FIG. 2 is a cross-sectional view of a metal substrate 200 of double-sided substrate structure according to another embodiment of the present disclosure. The metal substrate 200 of the double-sided substrate structure is similar to the metal substrate 100 of the double-sided substrate structure of FIG. 1E, and is constituted by two adhesive-containing metal substrates 10, 21 of the single-sided substrate structure. The metal substrate 21 of the single-sided substrate structure includes a second insulating substrate 206, a second adhesive layer 208 and a second metal layer 207. The difference is that a side of the second insulating substrate 206 of the metal substrate 21 of the single-sided substrate structure facing the release layer 105 has a second modified surface 206c the same as the first modified surface 101c. Since the structure of the metal substrate 10 of the single-sided substrate structure and the method of manufacturing the same are described above, detailed process is not repeated herein, and the same elements will be represented with the same reference numerals.

In addition, it is noteworthy that one or both of the metal substrate of the double-sided substrate structure may be non-adhesive metal substrates of the single-sided substrate structure though in the above embodiment, the metal substrate of the double-sided substrate structure is constituted by the two adhesive-containing metal substrates of the single-sided substrate structure.

Figure 3:
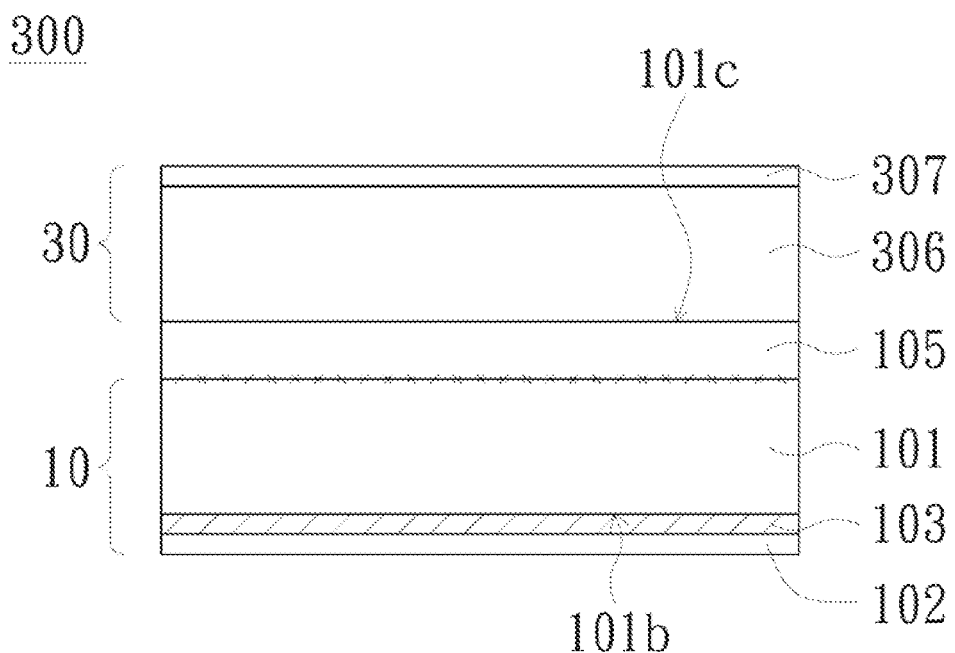
FIG. 3 is a cross-sectional view of a metal substrate of double-sided substrate structure according to further embodiment of the present disclosure.

FIG. 3 is a cross-sectional view of a metal substrate 300 of double-sided substrate structure according to further embodiment of the present disclosure. The metal substrate 300 of the double-sided substrate structure is similar to the metal substrate 100 of the double-sided substrate structure of FIG. 1E and is constituted by two metal substrates 10, 30 of the single-sided substrate structure. The difference is that the metal substrate 30 of the single-sided substrate structure bonded on the first modified surface 101c of the first insulating substrate 101 is a non-adhesive metal substrate of the single-sided substrate structure. The metal substrate 30 of the single-sided substrate structure 30 includes a second insulating substrate 306 and a second metal layer 307 directly bonded on a side of the second insulating substrate 306. The second insulating substrate 306 is between the second metal layer 307 and the first modified surface 101c of the first insulating substrate 101. Since the structure of the metal substrate 10 of the single-sided substrate structure and the method of manufacturing the same are described above, detailed process is not repeated herein, and the same elements will be represented with the same reference numerals.

Figure 4:
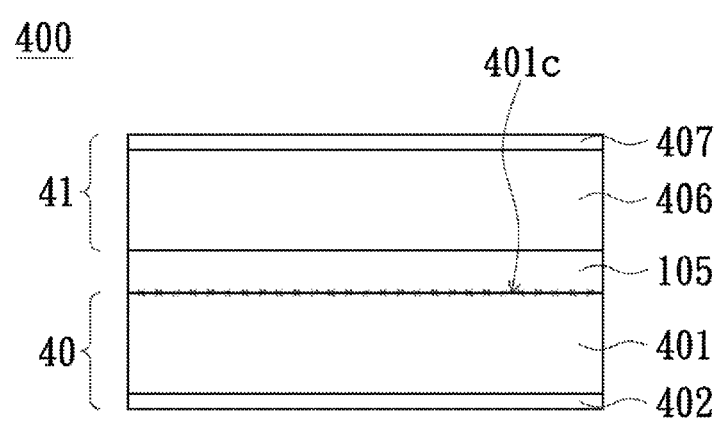
FIG. 4 is a cross-sectional view of a metal substrate of double-sided substrate structure according to another embodiment of the present disclosure.

FIG. 4 is a cross-sectional view of a metal substrate 400 of double-sided substrate structure according to another embodiment of the present disclosure. The metal substrate 400 of the double-sided substrate structure is similar to the metal substrate 100 of the double-sided substrate structure of FIG. 1E, and is constituted by two metal substrates 40, 41 of the single-sided substrate structure. The difference is that the two metal substrates 40, 41 of the single-sided substrate structure are non-adhesive metal substrates of the single-sided substrate structure. The metal substrate 40 of the single-sided substrate structure includes a first insulating substrate 401 and a first metal layer 402 directly bonded on a side of the first insulating substrate 401 opposite to the first modified surface 401c; the metal substrate 41 of the single-sided substrate structure includes a second insulating substrate 406 and a second metal layer 407 directly bonded on a side of the second insulating substrate 406 opposite to the release layer 105.

Referring to FIG. 1E, a whole process of a flexible printed circuit board are performed on the metal substrate 100 of the double-sided substrate structure having the two adhesive-containing metal substrates 10, 11 of the single-sided substrate structure, which includes wet processes, such as exposure, development, etching, film removing and electroplating processes, and subsequent high temperature process to form printed circuit boards at both sides. The two adhesive-containing printed circuit boards are then separated to form two adhesive-containing single-sided flexible printed circuit boards (not shown), and thus to significantly increase process efficiency and productivity of the flexible printed circuit board process.

Figure 1F:
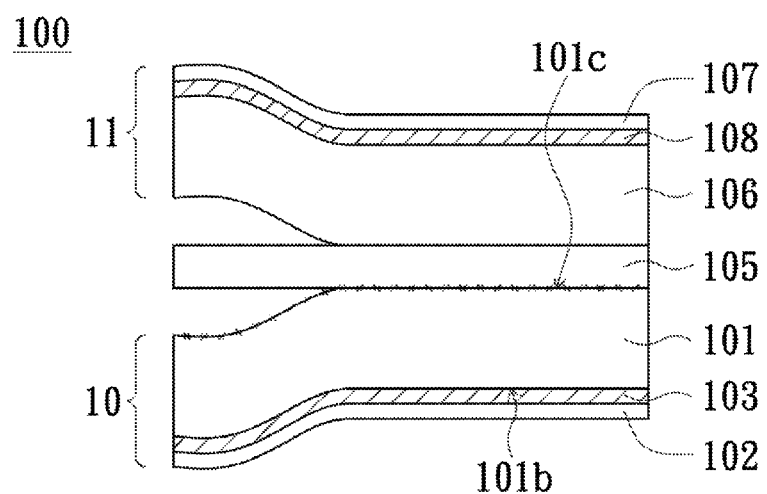

In some embodiments of the present disclosure, mechanical force is used to separate the two metal substrates 10, 11 of the single-sided substrate structure, as shown in FIG. 1F. In some embodiments of the present disclosure, a peeling strength for separating the two metal substrates 10, 11 of the single-sided substrate structure is substantially greater than 80 gf/cm, preferably in a range of 100 gf/cm to 600 gf/cm.

The metal substrate 100 of the double-sided substrate structure formed using the thermal lamination process 109 has enough thickness to reinforce stiffness of the metal substrate 10 or 11 of the single-sided substrate structure and thus to exhibit better mechanical properties compared to only the metal substrate 10 or 11 of the single-sided substrate structure. Therefore, problems such as fold damage, pad damage or delamination during the whole process of the flexible printed circuit board including wet processes, such as exposure, development, etching, film removing and electroplating processes, and high temperature processes, such as baking, fast compression, coverlay curing and surface mounting, may not occur at the metal substrates.

In addition, the surface energy of the modified surface 101c of the first insulating substrate 101 is substantially less than that of a general adhesive (about greater than 3 dyne/cm), and thus the release layer 105 may be easily removed to separate the metal substrates 10, 11 of the single-sided substrate structure from each other without any residual adhesive to increase process yield of the flexible printed circuit board process. In some embodiments of the present disclosure, the first insulating substrate 101 of the metal substrate 10 of the single-sided substrate structure after separation and before bonding has a thickness variation substantially less than 10%. The second insulating substrate 106 of the metal substrate 11 of the single-sided substrate structure after separation and before bonding has a thickness variation substantially less than 10%. In addition, the first modified surface 101c of the first insulating substrate 101 before and after bonding to the release layer 105 has a surface roughness variation substantially less than 10%.

According to the above embodiments, the present disclosure provides a metal substrate, which includes two metal substrates of single-sided substrate structure respectively having an insulating substrate and a metal layer, and the insulating substrates are bonded to each other by a release layer. A modification process is performed on a bonding surface of one of the insulating substrates of the metal substrates of the single-sided substrate structure to form a modified surface. When the insulating substrate is released from the release layer (or the other insulating substrate), the modified surface has a surface roughness variation substantially less than 10% compared to the original surface roughness before the modified surface is bonded on the release layer.

The double-layer metal substrate can be used to manufacture a printed circuit board to not only enhance structural strength of the metal substrates of the single-sided substrate structure but also prevent fold damage, pad damage or delamination, and thus to increase yield of the printed circuit hoard. Further, because the modified surface of the insulating substrate has a low surface energy and thus the insulating substrate can be bonded on and then easily released from the release layer without any residual adhesive, the two metal substrates of the single-sided substrate structure can be temporarily laminated and then separated after a whole process of the printed circuit board is performed to form two printed circuit boards respectively having the single-sided substrate structure, and thus to significantly increase efficiency and productivity of the printed circuit board process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A metal substrate, comprising:
a first insulating substrate having a first modified surface and a second surface opposite to the first modified surface, wherein the first modified surface has a surface energy between 15 and 25 dyne/cm;
a first metal layer laminating on the second surface;
a release layer bonding on the first modified surface, such that the first insulating substrate is between the release layer and the first metal layer;
a second insulating substrate bonding on the other side of the release layer, such that the release layer is between the first modified surface and the second insulating substrate; and
a second metal layer disposed on the other side of the second insulating substrate, such that the second insulating substrate is between the release layer and the second metal layer,
wherein each of the first insulating substrate and the second insulating substrate is made of a material selected from the group consisting of polyimide (PI), polyethylene terephthalate (PET), Teflon, liquid crystal polymer (LCP), polyethylene (PE), polypropylene (PP), polystyrene (PS), polyvinyl chloride (PVC), Nylon (polyamide), acrylic resin, acrylonitrile-butadiene-styrene (ABS), phenolic resin, epoxy resin, polyester, silicone, polyurethane (PU), polyamide-imide (PAI) and a combination thereof.

2. The metal substrate of claim 1, further comprising a first adhesive layer between the first insulating substrate and the first metal layer.

3. The metal substrate of claim 1, further comprising a second adhesive layer between the second insulating substrate and the second metal layer.

4. The metal substrate of claim 1, further comprising:
a first adhesive layer between the first insulating substrate and the first metal layer; and
a second adhesive layer between the second insulating substrate and the second metal layer.

5. The metal substrate of claim 1, wherein the side of the second insulating substrate bonding on the release layer has a second modified surface the same as the first modified surface.

6. The metal substrate of claim 1, wherein the release layer comprises an elastomeric pressure sensitive adhesive or a resin-based pressure sensitive adhesive.

7. The metal substrate of claim 1, wherein the first modified surface comprises at least one functional group selected from the group consisting of —$CH_3$, —$CH_2$, —O—, —COOH, —$COOHCH_3$, —$COOHC_2H_5$, —$NH_2$, —$NO_2$, —OH, —$CONH_2$, —CONH, —$SiO_2$ and a combination thereof.

8. The metal substrate of claim 1 wherein the first modified surface has a surface energy substantially greater than 3 dyne/cm.

9. The metal substrate of claim 1, wherein the first metal layer and the second metal layer comprise Cu, Al, Au, Ag, Sn, Pb, Sn—Pb Alloy, Fe, Pd, Ni, Cr, Mo, W, Zn, Mn, Co, stainless steel or a combination thereof.

* * * * *